US008097963B1

(12) United States Patent  
Cate et al.

(10) Patent No.: US 8,097,963 B1  
(45) Date of Patent: Jan. 17, 2012

(54) ELECTRICALLY CONDUCTIVE MATRIX FOR Z-AXIS INTERCONNECT

(75) Inventors: Steven D. Cate, Los Altos, CA (US);  
Ajay K. Ghai, San Jose, CA (US);  
Tarak A. Railkar, Plano, TX (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 181 days.

(21) Appl. No.: 12/431,694

(22) Filed: Apr. 28, 2009

(51) Int. Cl.  
*H01L 29/40* (2006.01)

(52) U.S. Cl. .................................... 257/786; 257/701

(58) Field of Classification Search .................. 257/786, 257/784, 701, 698  
See application file for complete search history.

(56) References Cited

U.S. PATENT DOCUMENTS

| 4,811,081 | A | * | 3/1989 | Lyden | 257/668 |
| 5,440,240 | A | * | 8/1995 | Wood et al. | 324/750.05 |
| 6,524,115 | B1 | * | 2/2003 | Gates et al. | 439/66 |
| 6,574,114 | B1 | * | 6/2003 | Brindle et al. | 361/769 |
| 2006/0071316 | A1 | * | 4/2006 | Garth | 257/686 |

* cited by examiner

Primary Examiner — S. V. Clark  
(74) Attorney, Agent, or Firm — Advent IP, P.C., L.L.O.

(57) ABSTRACT

An IC package including one or more z-axis interconnects for performing at least in part the fan-in/fan out interconnection for electrically coupling contacts of semiconductor die to external contacts of the package. The z-axis interconnect comprises a matrix of electrically conducting elements extending from the top to the bottom surface of the interconnect. Each conductive element is internally insulated from other conductive elements of the matrix. The semiconductor contacts may be electrically coupled to separate portions of the matrix by way of electrical connections to the top of the z-axis interconnect. Similarly, the external contacts of the package may be electrically coupled to the same separate portions of the matrix by way electrical connections to the bottom of the interconnect. The z-axis interconnect improves the miniaturization, integration, thermal and electrical performance of IC packages. The z-axis interconnect need not be limited to IC package applications, but may be used to electrically interconnect other configurations.

23 Claims, 9 Drawing Sheets

ELECTRICALLY CONDUCTIVE MATRIX FOR Z-AXIS INTERCONNECT

FIELD

This invention relates generally to integrated circuits, and in particular, to a z-axis interconnect comprising of an electrically conductive matrix for routing electrical connections in a generally vertical or z-axis direction.

BACKGROUND

Integrated circuit (IC) packages typically include a semiconductor die (e.g., a silicon semiconductor chip) that is suitably protected. Generally, the semiconductor die includes a plurality of electrical contacts (e.g., metal pads or ball grid array (BGA)) for transmitting and receiving signals, supply voltages, electrical, optical and/or other parameters to and from one or more external devices. Typically, the contacts of a semiconductor die are electrically or otherwise coupled respectively to external contacts (e.g., pins or BGA balls) of an IC package. Typically, the external contacts of an IC package have a pitch (i.e., distance between adjacent contacts) larger than the pitch of the contacts of a semiconductor die. Generally then, an IC package employs a complex interconnection (usually referred to as a fan-in/fan-out interconnect) to route the electrical connections from the semiconductor die contacts to the IC package external contacts.

In the past, a fan-in/fan-out interconnect typically consists of several stacked routing layers. Generally, each routing layer includes upper conductive traces disposed on a top surface of the layer, lower conductive traces disposed on a bottom surface of the layer, and a plurality of metalized via holes electrically connecting the upper traces to the lower traces. Usually, the semiconductor die is disposed on the top surface of the upper-most routing layer of the fan-in/fan-out interconnect, and makes electrical contact to its upper conductive traces. Similarly, the external contacts of the IC package are disposed on the bottom surface of the lower-most routing layer of the fan-in/fan-out interconnect, and make electrical contact to its lower conductive traces.

The typical fan-in/fan-out interconnect discussed above has drawbacks that hinder the miniaturization, integration, cost reduction, thermal control, and improved electrical performance of integrated circuits. With regard to miniaturization and integration, the current fan-in/fan-out interconnect generally has limitations on the minimum dimensions and spacing for conductive traces and metalized via holes formed on and through the routing layers of the interconnect. Additionally, the fan-in/fan-out interconnect typically requires a relatively large number of stacked routing layers to provide the necessary fan-in/fan-out interconnection. Furthermore, since the stacked routing layers are mostly made out of a relatively low thermal conductivity dielectric, thermal control of the semiconductor die is generally a challenge.

SUMMARY

An aspect of the invention relates to an integrated circuit (IC) package including one or more z-axis interconnects for performing at least in part the fan-in/fan out interconnection for electrically coupling the contacts of a semiconductor die to the external contacts of the package. In particular, the z-axis interconnect comprises a matrix of electrically conducting elements extending from the top to the bottom surface of the z-axis interconnect. Each of the electrically conductive element is insulated from other electrical conductive elements of the matrix.

The contacts of the semiconductor die may be electrically coupled to separate portions (sets of electrically conducting elements) of the matrix by way of respective electrical connections to the top surface of the z-axis interconnect. Similarly, the external contacts of the package may be electrically coupled to the separate portions (sets of electrically conducting elements) of the matrix by way of respective electrical connections to the bottom surface of the z-axis interconnect. Thus, the contacts of the semiconductor die are electrically coupled to the external contacts of the IC package by way of one or more z-axis interconnects.

The spacing between adjacent electrical contacting elements of the z-axis interconnect may be in the range of a few microns to a few nanometers. Thus, the fan-in/fan-out interconnect is no longer bound by the dimension and spacing of traditional routing layers, as previously discussed. This allows for further miniaturization and higher integration of IC packages. Additionally, as further elaborated herein, the z-axis interconnect further reduces the number of routing layers needed to effectuate the required fan-in/fan-out interconnection. This leads to reduced costs and complexity in manufacturing IC packages.

Further, because of the large number of electrical conducting elements present in the z-axis interconnect, it helps remove heat from the semiconductor die to achieve improved thermal performance of IC packages. Moreover, the electrical conducting elements of the z-axis interconnect may help improve the electrical performance of the IC package by providing additional capacitance, inductance, resistive, fusing, and other electrical parameters to the fan-in/fan-out interconnection.

In other aspects of the disclosure, the z-axis interconnect need not be limited to IC package fan-in/fan-out applications, but may be used to electrically interconnect other configurations. For example, one or more z-axis interconnects may be used to electrically connect contacts of one or more components to corresponding contacts of one or more PC boards. Additionally, one or more z-axis interconnects may be used to electrically connect contacts of one or more PC boards to contacts of one or more subsystems. Furthermore, in this regards, one or more z-axis interconnects may be used to electrically connect contacts of one or more subsystems to contacts of one or more systems.

Other aspects, advantages and novel features of the disclosure will become apparent from the following detailed description of the invention when considered in conjunction with the accompanying drawings.

DETAILED DESCRIPTION OF THE EXEMPLARY EMBODIMENTS

Figure 1A:
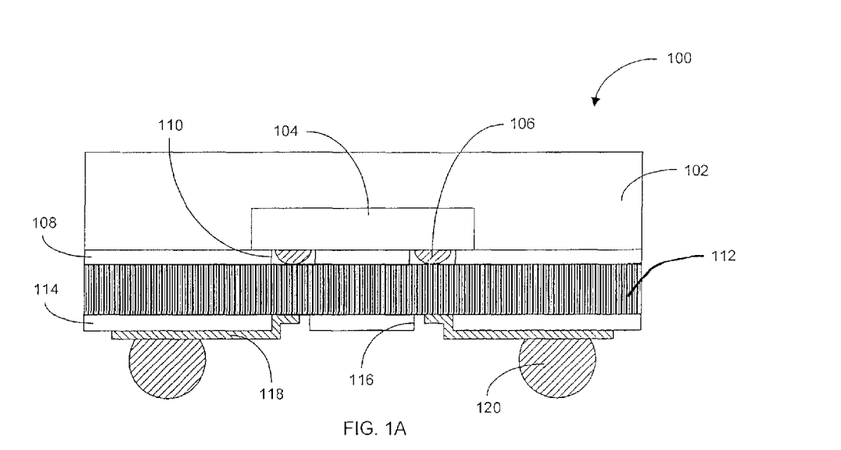
FIGS. 1A-1B illustrate respectively side-sectional and top views of an exemplary IC package in accordance with an aspect of the disclosure.
Figure 1B:
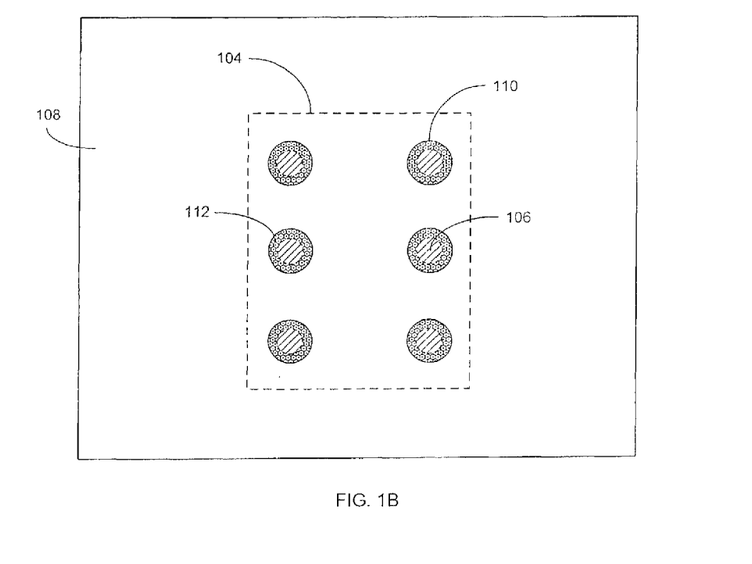

FIGS. 1A-1B illustrate respectively side-sectional and top views of an exemplary IC package 100 in accordance with an aspect of the disclosure. In summary, the IC package 100 includes a z-axis interconnect comprising a matrix or array of electrical conducting elements extending from a top surface to a bottom surface of the z-axis interconnect. Each electrical conducting element of the matrix is electrically insulated from one or more adjacent electrical conducting elements of the matrix. The z-axis interconnect may be used to route electrical connections from contacts of a semiconductor die to external contacts of an IC package.

In particular, the IC package 100 comprises an electrically-insulated cover 102, a semiconductor die 104 including one or more electrical contacts 106 (e.g., ball grid array (BGA)), an upper dielectric layer 108 including one or more openings 110, a z-axis interconnect 112, a lower dielectric layer 114 including one or more openings 116, one or more conductive traces 118, and one or more external electrical contacts 120 (e.g., BGA). Although, in this example, a single semiconductor die 104 is shown, it shall be understood that that IC package 100 may include a plurality of semiconductor dies that interconnect with the external contacts 120 via one or more z-axis interconnects, as discussed below. This applies to all of the embodiments described herein.

The electrically-insulated cover 102 protects and covers the top and sides of the semiconductor die 104. The upper dielectric layer 108 electrically insulates the semiconductor die 104 from the electrical conducting elements of the z-axis interconnect 112, except where there are openings 110 in the upper dielectric layer 108. In this example, the electrical contacts 106 of the semiconductor die 104 are situated within respective openings 110 of the upper dielectric layer 108 to make electrical connection with respective sets of electrical conducting elements of the z-axis interconnect 112 situated directly below the openings 110.

The respective sets of electrical conducting elements of the z-axis interconnect 112 electrically couple the contacts 106 of the semiconductor die 104 to the conductive traces 118 situated within respective openings 116 of the lower dielectric layer 114. The lower dielectric layer 114 electrically insulates the conductive traces 118 from other electrical conducting elements of the z-axis interconnect 112 that are not in electrical contact with the conductive traces 118. The conductive traces 118 make respective electrical contacts to the external contacts 120 (e.g., BGA) of the IC package 100. Thus, each electrical contact 106 of the semiconductor die 104 may be electrically coupled to an external contact 120 of the IC package 100 by way of a set of electrical conducting elements (e.g., situated directly below opening 110 and directly above opening 116) of the z-axis interconnect 112, and a corresponding conductive trace 118.

As shown, the z-axis interconnect 112 provides a fan-in/fan-out interconnect for electrically connecting the contacts 106 of the semiconductor die 104 to the external electrical contacts 120 of the IC package 100. The spacing between adjacent electrical contacting elements of the z-axis interconnect 112 may be on the order of a few microns or a few nanometers. Thus, the fan-in/fan-out interconnect is no longer bound by the dimension and spacing of traditional routing layers, as previously discussed. This allows for further miniaturization and higher integration of IC packages.

Additionally, as further elaborated herein, the z-axis interconnect 112 further reduces the number of stacked routing layers needed to effectuate the required fan-in/fan-out interconnection. This may reduce costs and complexity in manufacturing IC packages. Further, because of the large number of electrical conducting elements present in the z-axis interconnect 112, it help remove heat from the semiconductor die 104 to achieve improved thermal performance of IC packages. Moreover, the electrical conducting elements of the z-axis interconnect 112 may help improve the electrical performance of the IC package 100 by providing additional capacitance, inductance, resistive, fusing, and other electrical parameters to the fan-in/fan-out interconnection.

Figure 2A:
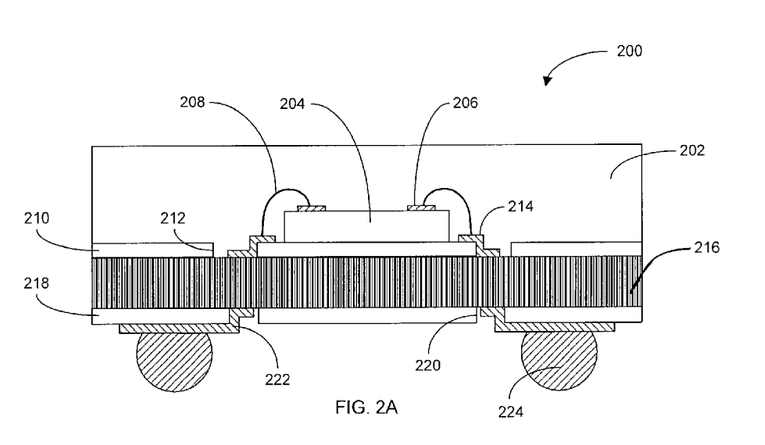
FIGS. 2A-2B illustrate respectively side-sectional and top views of another exemplary IC package in accordance with another aspect of the disclosure.
Figure 2B:
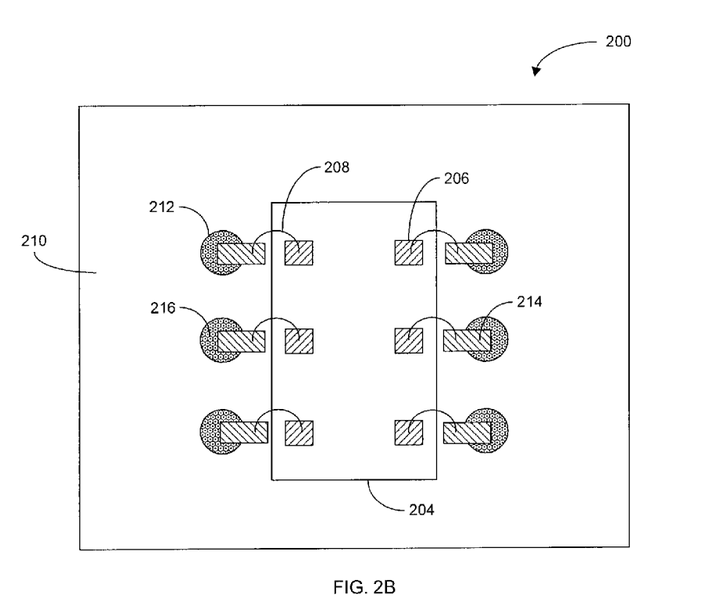

FIGS. 2A-2B illustrate respectively side-sectional and top views of another exemplary IC package 200 in accordance with another aspect of the disclosure. In summary, the IC package 200 is similar to the previous embodiment 100, except that the semiconductor die is configured in a wirebond manner, instead of in a flip-chip manner. As with the previous embodiment, the IC package 200 includes a z-axis interconnect for routing the electrical connection from the contacts of the semiconductor die to the external electrical contacts of the IC package.

In particular, the IC package 200 comprises an electrically-insulated cover 202, a semiconductor die 204 including one or more electrical contacts 206 (e.g., contact pads), an upper dielectric layer 210 including one or more openings 212, one or more upper conductive traces 214, one or more wirebonds 208, a z-axis interconnect 216, a lower dielectric layer 218 including one or more openings 220, one or more lower conductive traces 222, and one or more external electrical contacts 224 (e.g., BGA).

The electrically-insulated cover 202 protects and covers the top and sides of the semiconductor die 204. The upper dielectric layer 210 electrically insulates the semiconductor die 204 from the electrical conducting elements of the z-axis interconnect 216, except where there are openings 212 in the upper dielectric layer 210. In this example, the contact pads 206 of the semiconductor die 204 are electrically connected to the upper conductive traces 214 via respective wirebonds 208. Portions of the upper conductive traces 214 are situated within respective openings 212 of the upper dielectric layer 210 to make electrical contact with respective sets of electrical conducting elements of the z-axis interconnect 216 situated directly below the openings 212.

The respective sets of electrical conducting elements of the z-axis interconnect 216 electrically couple the upper conductive traces 214 to the lower conductive traces 222 situated within respective openings 220 of the lower dielectric layer 218. The lower dielectric layer 218 electrically insulates the conductive traces 218 from other electrical conducting elements of the z-axis interconnect 216 that are not in contact with the lower conductive traces. The lower conductive traces 222 make respective electrical contacts to the external contacts 224 (e.g., BGA) of the IC package 200. Thus, each electrical contact pad 206 of the semiconductor die 204 is electrically coupled to an external contact 224 of the IC package 200 by way of a wirebond 208, upper conductive trace 214, a set of electrical conductors (e.g., situated directly below opening 212 and directly above opening 220) of the z-axis interconnect 216, and a lower conductive trace 222.

Figure 2C:
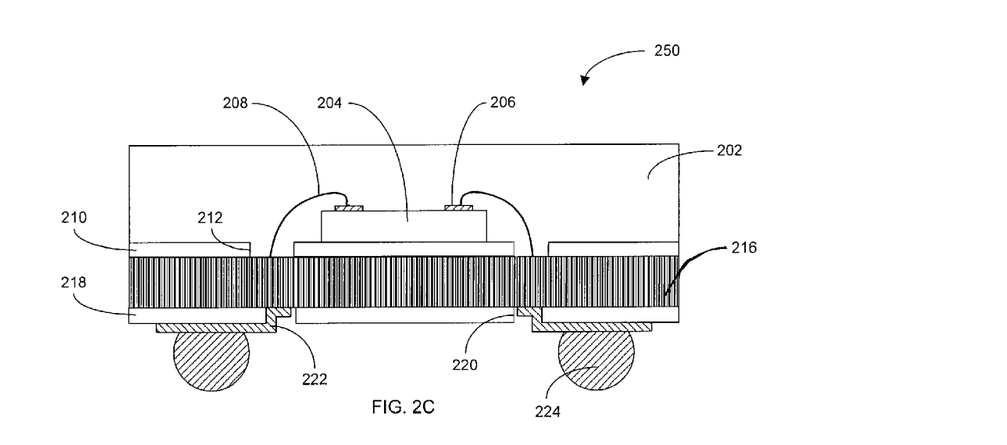
FIGS. 2C-2D illustrate respectively side-sectional and top views of another exemplary IC package in accordance with another aspect of the disclosure.
Figure 2D:
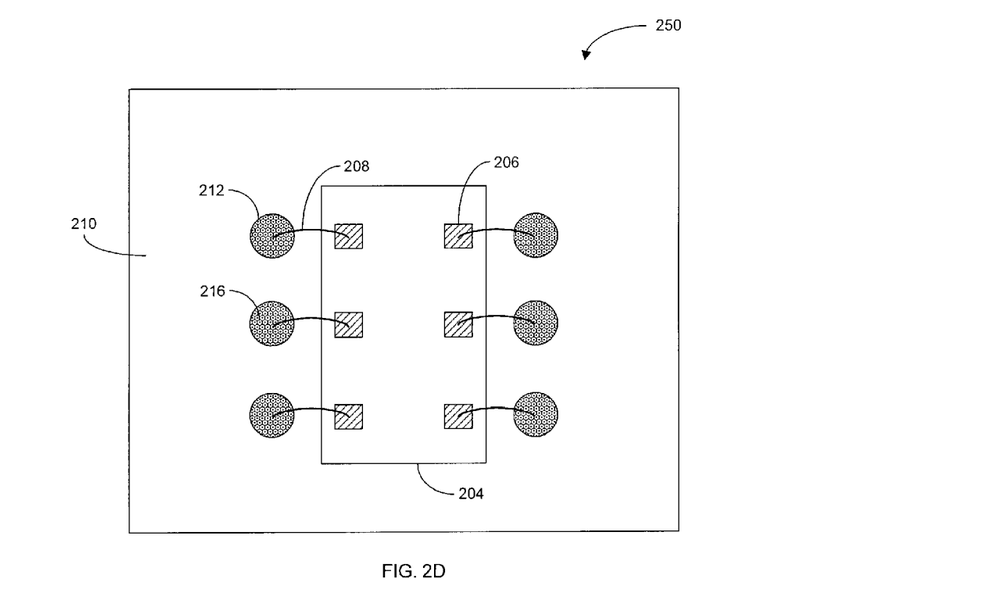

FIGS. 2C-2D illustrate respectively side-sectional and top views of another exemplary integrated circuit package 250 in accordance with another aspect of the disclosure. In summary, IC package 250 is a variation of the previous embodiment 200. Accordingly, the same reference numbers are used to identify the same elements. The IC package 250 differs from IC package 200 in that the wirebonds 208 coming from the contact pads 206 of the semiconductor die 204 make electrical connection directly to the z-axis interconnect 216; thereby eliminating the upper conductive traces 214 of the previous embodiment 200. Thus, in this case, each electrical contact pad 206 of the semiconductor die 204 is electrically coupled to an external contact 224 of the IC package 250 by way of a wirebond 208, a set of electrical conductors (e.g., situated directly below opening 212 and directly above opening 220) of the z-axis interconnect 216, and a conductive trace 222.

Figure 3:
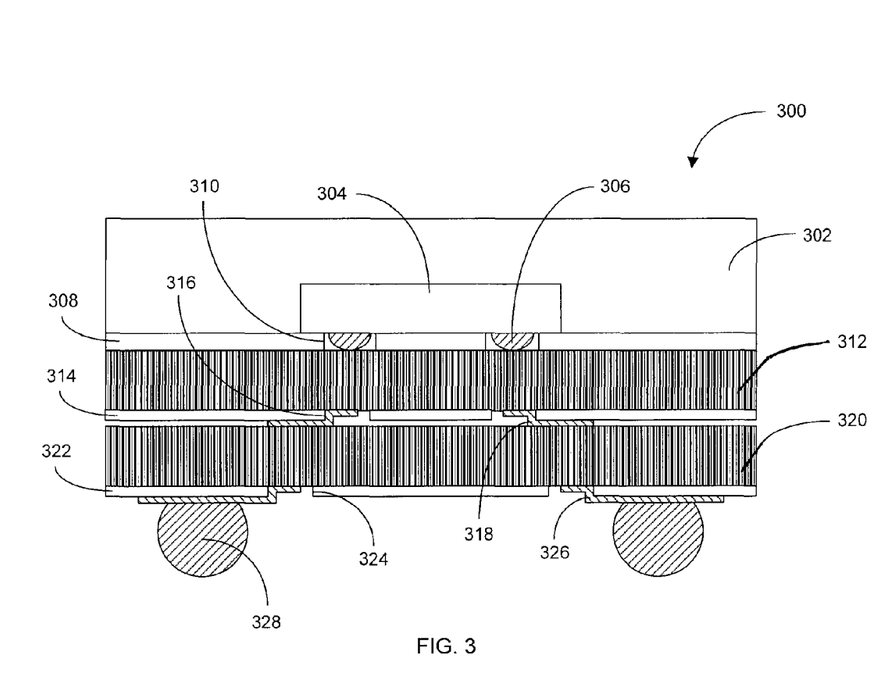
FIG. 3 illustrates a side sectional view of another exemplary IC package in accordance with another aspect of the disclosure.

FIG. 3 illustrates a side sectional view of another exemplary IC package 300 in accordance with another aspect of the disclosure. In summary, the IC package 300 includes a plurality of z-axis interconnects for routing the electrical connection from the contacts of the semiconductor die to the external contacts of the IC package 300. It shall be understood that any of the embodiments described herein may include any number of z-axis interconnects for performing the fan-in/fan-out of the IC package.

In particular, the IC package 300 comprises an electrically-insulated cover 302, a semiconductor die 304 including one or more electrical contacts 306 (e.g., BGA), an upper dielectric layer 308 including one or more openings 310, an upper z-axis interconnect 312, an intermediate dielectric layer 314 including one or more openings 316, one or more upper conductive traces 318, a lower z-axis interconnect 320, a lower dielectric layer 322 including one or more openings 324, one or more lower conductive traces 326, and one or more external contacts 328 (e.g., BGA).

The electrically-insulated cover 302 protects and covers the top and sides of the semiconductor die 304. The upper dielectric layer 308 electrically insulates the semiconductor die 304 from the electrical conducting elements of the upper z-axis interconnect 312, except those electrical conducting elements directly below the openings 310 in the upper dielectric layer 308. In this example, the electrical contacts 306 of the semiconductor die 304 are situated within respective openings 310 of the upper dielectric layer 308 to make electrical contact with respective sets of electrical conducting elements of the upper z-axis interconnect 312 situated directly below the openings 310.

The respective sets of electrical conducting elements of the upper z-axis interconnect 312 under openings 310 electrically couple the semiconductor die contacts 306 to the upper conductive traces 318 situated within respective openings 316 of the intermediate dielectric layer 314. The intermediate dielectric layer 314 electrically insulates the electrical conducting elements of the upper z-axis interconnect 312 from the electrical conducting elements of the lower z-axis interconnect 320, except those that are electrically coupled together by the upper conductive traces 318. The sets of electrical conducting elements of the lower z-axis interconnect 320 electrically couple upper conductive traces 318 respectively to lower conductive traces 326.

The lower dielectric layer 322 electrically insulates the lower conductive traces 326 from other electrical conducting elements of the lower z-axis interconnect 320 that are not in electrical contact with the lower conductive traces 326. The lower conductive traces 326 are electrically coupled to the external contacts 328 of the IC package 300. Thus, each electrical contact 306 of the semiconductor die 304 is electrically coupled to an external contact 328 of the IC package 300 by way of a first set of electrical conducting elements (e.g., situated directly below opening 310 and directly above opening 316) of the upper z-axis interconnect 312, a corresponding upper conductive trace 318, a second set of electrical conducting elements (e.g., situated directly below the upper conductive trace 318 and directly above opening 324) of the lower z-axis interconnect 320, and the lower conductive trace 326.

Figure 4A:
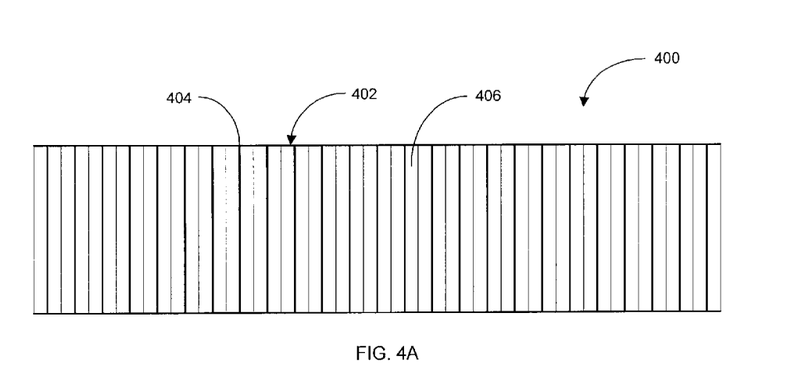
FIGS. 4A-4C illustrate respectively side-sectional views of exemplary z-axis interconnects in accordance with another aspect of the disclosure.
Figure 4B:
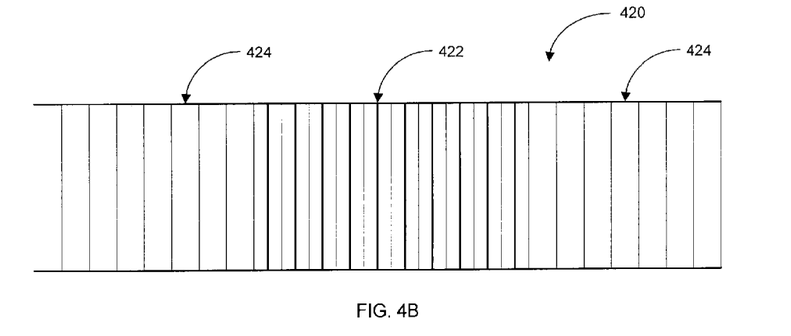
Figure 4C:
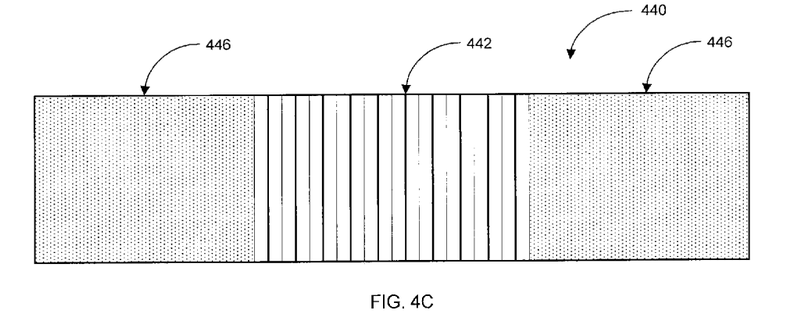

FIGS. 4A-4C illustrate respectively side-sectional views of exemplary z-axis interconnects 400, 420, and 440 in accordance with another aspect of the disclosure. The z-axis interconnect 400 comprises a plurality of electrical conductors 404 that extend from a top surface to a bottom surface of the z-axis interconnect. Each electrical conductor 404 is laterally surrounded or encased by an electrical insulator 406 such that adjacent conductors 404 do not make electrical contact with each other, unless electrically connected together by an external conductor situated at the top and/or bottom surface of the z-axis interconnect. Although, in this example, the electrical conductors 404 (and associated insulators 406) extend substantially vertical or perpendicular to the top and bottom surfaces of the z-axis interconnect 400, it shall be understood that they may extend at an acute angle with respect to the vertical or z-axis, for any of the embodiments described herein. Further, in this example, the electrical conductors 404 (and associated insulators 406) are distributed substantially across the entire lateral length of the z-axis interconnect 400.

The z-axis interconnect 420 differs from the previous embodiment 400 in that the electrical conductors (and associated insulators) are not distributed across the entire lateral length of the z-axis interconnect, but are localized within a portion of the interconnect. For instance, the z-axis interconnect 420 includes a portion 422 containing a matrix or array of electrical conductors (and associated insulators) extending from the top to the bottom surface of the z-axis interconnect. The z-axis interconnect 420 further include another portion 424 that only includes a matrix or array of only insulators extending from the top to the bottom surface of the z-axis interconnect. Thus, the z-axis interconnect 420 may be designed to include one or more electrical conducting portions 422 where it is needed in accordance with the IC package design.

The z-axis interconnect 440 is similar to the previous embodiment 420 in that it includes a portion 442 containing a matrix or array of electrical conductors (and associated insulators) extending from the top to the bottom surface of the z-axis interconnect. However, the z-axis interconnect 440 differs from the previous embodiment 420 in that the other portion 446 of the z-axis interconnect comprises a general electrical insulator 446, and not necessarily a matrix or array of insulators extending from the top to the bottom surface of the z-axis interconnect. Similar to the previous embodiment 420, the z-axis interconnect 440 may also be designed to include one or more electrical conducting portions 442 where it is needed in accordance with the IC package design.

Figure 5A:
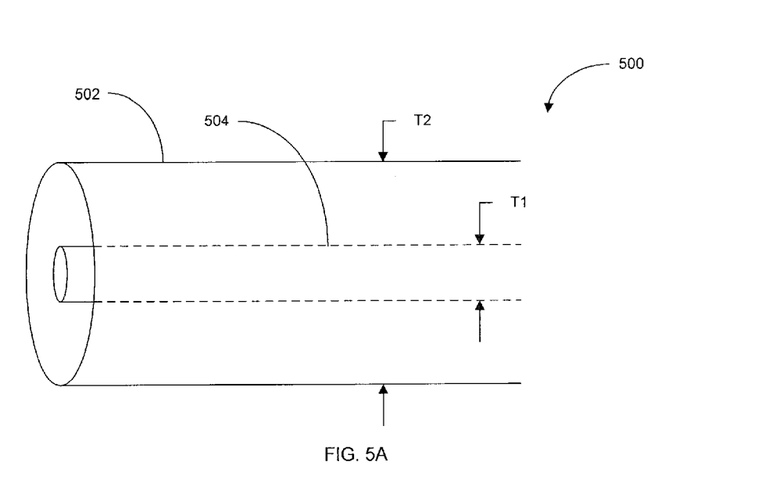
FIGS. 5A-5B illustrate respectively side views of exemplary electrical conducting elements of a z-axis interconnect layer in accordance with another aspect of the disclosure.

FIG. 5A illustrates a side view of an exemplary single electrical conducting element 500 of a z-axis interconnect layer in accordance with another aspect of the disclosure. In this exemplary embodiment, the electrical conducting element 500 comprises a substantially cylindrical electrical conductor 504 situated coaxially within a substantially cylindrical electrical insulator 502. Thus, in this example, the electrical conductor 504 has a substantially circular cross-section, and the electrical insulator 502 has a substantially doughnut-shaped cross-section. As an example, the diameter of the electrical conductor 504 may be between approximately one (1) nanometer to approximately 10 micrometers, and the diameter of the electrical insulator 502 may be between approximately 3 nanometers to approximately 25 micrometers. The electrical conductor 504 may be formed of any suitable conductor, such as copper, aluminum, gold, carbon nanofibers or nanotubes, etc. Thermal considerations may dictate the material.

Figure 5B:
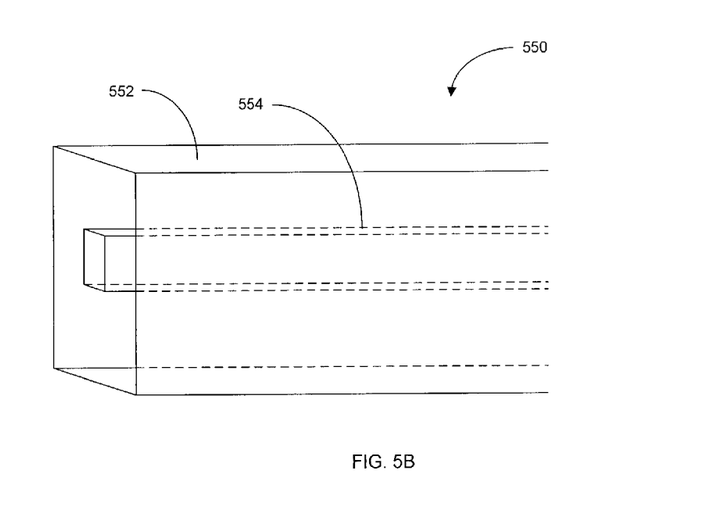

FIG. 5B illustrates a side view of another exemplary single electrical conducting element 550 of a z-axis interconnect layer in accordance with another aspect of the disclosure. The conducting element 550 includes a substantially centralized conductor 554 extending substantially longitudinally within an electrical insulator 552. In this example, the cross-section of the electrical conductor 502 is substantially square or rectangular in shape. Similarly, the cross-section of the electrical insulator 552 that is substantially square or rectangular in shape. It shall be understood that the electrical insulator 552 and conductor 554 may take on any cross-sectional shape including pentagon, hexagon, elliptical, irregular, etc. Additionally, the cross-sectional shape of the electrical conductor 554 need not have the same cross-sectional shape of the electrical insulator 552.

Figure 6A:
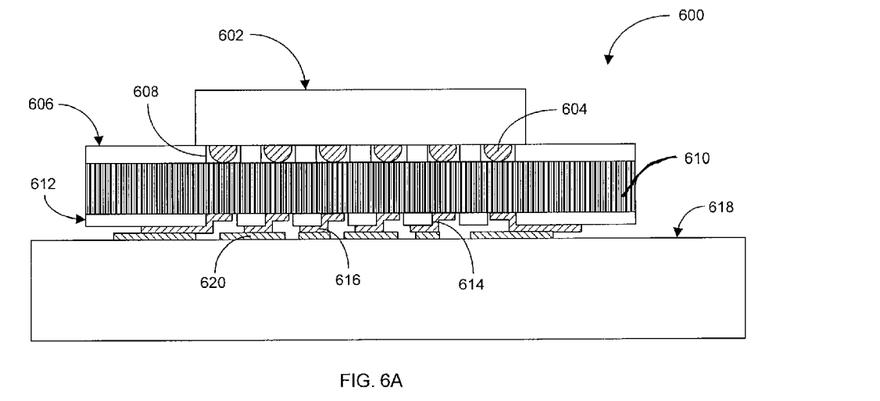
FIGS. 6A-6B illustrate respectively side-sectional views of exemplary circuit assemblies in accordance with another aspect of the disclosure.

FIG. 6A illustrates a side-sectional view of an exemplary circuit assembly 600 in accordance with another aspect of the disclosure. In the previous embodiments, the z-axis interconnect was used in an IC package for performing, at least in part, the fan-in/fan-out interconnection for the package. However, it shall be understood that the z-axis interconnect need not be limited to such internal IC package applications. It could be used to perform other z-axis interconnections, such as component-to-printed circuit (PC) board interconnections, PC board-to-subsystem interconnections, subsystem-to-system interconnections, and/or others. Circuit assembly 600 is an example of a z-axis interconnect being employed to perform at least in part a component-to-PC board interconnection.

In particular, the circuit assembly 600 comprises an IC package 602 including one or more contacts 604 (e.g., BGA), an upper dielectric layer 606 including one or more openings 608, a z-axis interconnect 610, a lower dielectric layer 612 including one or more openings 614, one or more conductive traces 616, and a PC board 618 including one or more contacts 620. Although an IC package 602 is used to exemplify a use of the z-axis interconnect 610, it shall be understood that another distinct component may be used in place of, or in addition to, the IC package 602.

The one or more contacts 604 of the IC package 602 make electrical connection respectively to one or more sets of electrical conducting elements of the z-axis interconnect 610 situated directly below one or more openings 608 of the upper dielectric layer 606. The one or more sets of electrical conducting elements of the z-axis interconnect 610, in turn, make electrical connection respectively to one or more conductive traces 614 situated directly below the one or more openings 614 of the lower dielectric layer 612. The one or more conductive traces 614, in turn, make electrical connection to the contacts 620 of the PC board 618. Accordingly, the one or more contacts 604 of the IC package 602 are electrically coupled to one or more contacts 620 of the PC board 618 by way of the z-axis interconnect 610 and the conductive traces 616.

Figure 6B:
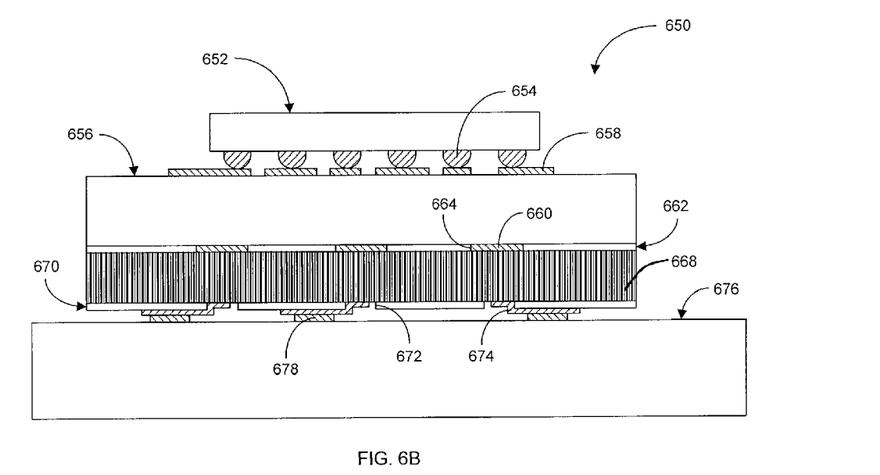

FIG. 6B illustrates side-sectional views of another exemplary circuit assembly 650 in accordance with another aspect of the disclosure. Circuit assembly 650 is an example of a z-axis interconnect employed to perform at least in part an electrical connection between a component and a subsystem or system. In particular, circuit assembly 650 comprises an IC package 652 (or other component) including one or more contacts 654, a PC board 656 including one or more upper conductive traces 658 and one or more lower conductive traces 660, an upper dielectric layer 662 including one or more openings 664, a z-axis interconnect 668, a lower dielectric layer 670 including one or more openings 672, one or more conductive traces 674, and a subsystem or system 676 including one or more contacts 678.

The one or more contacts 654 of the IC package 652 make electrical connection respectively to one or more upper conductive traces 658 of the PC board 656. The PC board 658 typically includes one or more metalized via holes (not shown) electrically connecting its one or more upper conductive traces 658 to its one or more lower conductive traces 660. The one or more lower conductive traces 660 of the PC board 656 make electrical connection respectively to one or more sets of electrical conducting elements of the z-axis interconnect 668 situated directly below one or more openings 664 of the upper dielectric layer 662. The one or more sets of electrical conducting elements of the z-axis interconnect 668, in turn, make electrical connection respectively to one or more conductive traces 674 situated directly below the one or more openings 672 of the lower dielectric layer 670. The one or more conductive traces 674, in turn, make electrical connection to the one or more contacts 678 of the subsystem or system 676. Accordingly, the one or more contacts 654 of the IC package 652 are electrically coupled to one or more contacts 678 of the subsystem or system 676 by way of the traces 658 and 660 of the PC board 658, the z-axis interconnect 668 and the traces 674.

Figure 7A:
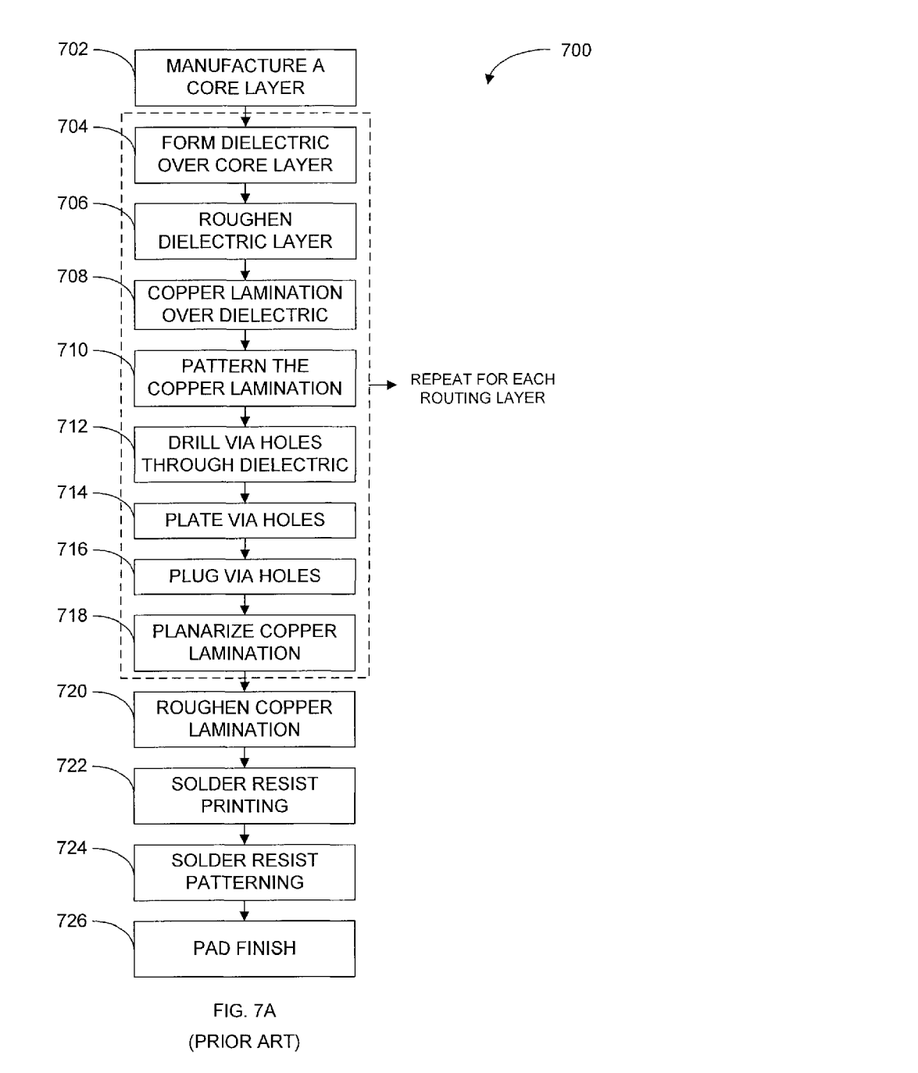
FIG. 7A illustrates a flow chart of a conventional method of forming a routing interconnect for an IC package.

FIG. 7A illustrates a flow chart of an exemplary conventional method 700 of forming a fan-in/fan-out routing interconnect of an IC package. This method 700, in conjunction with method 750 discussed below, is used to illustrate the benefits of using a z-axis interconnect. The conventional method 700, which does not utilize a z-axis interconnect, begins with the manufacturer of a core layer (block 702). Then, a dielectric layer is formed over the core layer (block 704). The top surface of the dielectric layer is then roughened to improve adhesion to a subsequent conductive layer (block 706). Then, a conductive layer is formed over the roughened surface of the dielectric layer using a metal such as copper (block 708). This layer is then patterned in accordance with the circuit design (block 710).

Then, via holes are formed through the dielectric layer in accordance with the circuit design (block 712). The via holes may then be plated with a conductive layer (block 714) and/or filled with a metalized, conductive or insulating plug (block 716). Then, the top surface of the dielectric layer is planarized to even out the surface (block 718). The operations identified in blocks 704 through 718 are then repeated for each routing or interconnect layer needed for performing the routing for a fan-in/fan-out IC package. Once all of the routing or interconnect layers are formed, the top surface of the interconnect structure is roughened to improve adhesion to the top insulating layer (block 720). Then, a solder resist is formed on the top surface of the interconnect structure (block 722). Then, the solder resist is patterned in accordance with the circuit design (block 724). And finally, the contact pads for the interconnect structure are finished (block 726).

Figure 7B:
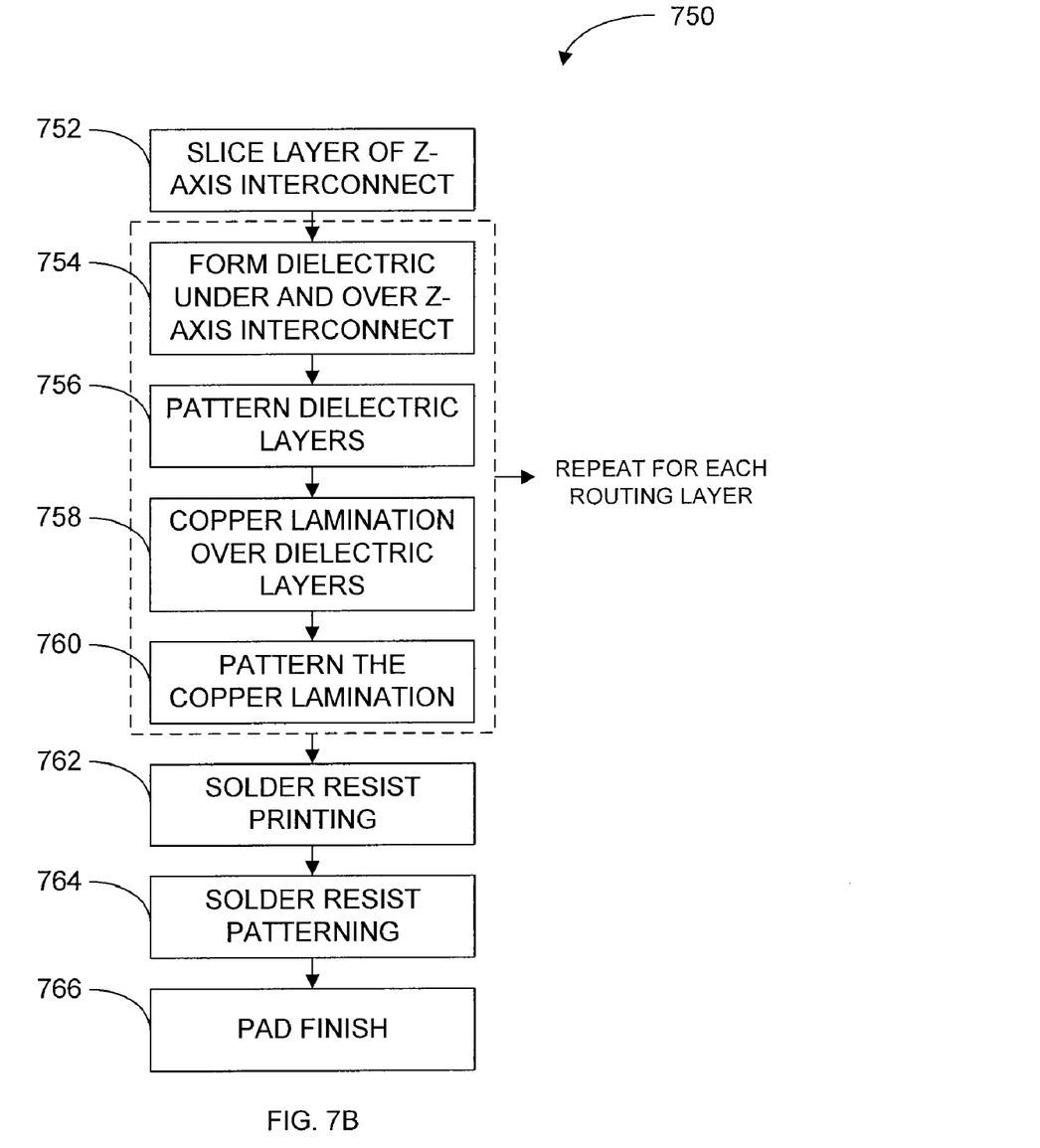
FIG. 7B illustrates a flow chart of an exemplary method of forming a routing interconnect for an IC package in accordance with another aspect of the disclosure.

FIG. 7B illustrates a flow chart of an exemplary method 750 of forming a fan-in/fan-out routing interconnect of an IC package in accordance with another aspect of the disclosure. The method 752 may begin with slicing one or more strips of a z-axis interconnect material to generate one or z-axis interconnects as needed in accordance with the circuit design (block 752). Then, a dielectric layer is formed over the z-axis interconnect (block 754). The dielectric layer is then patterned to form openings to expose the top surface of the z-axis interconnect in accordance with the circuit design (block 756). Then, a copper lamination is formed over the dielectric layer (block 758). Then, the copper lamination is patterned in accordance with the circuit design (block 760). The operations identified in blocks 754 through 760 are then repeated for each routing or interconnect layer needed for performing the fan-in/fan-out of the IC package. Once all of the routing or interconnect layers are formed, solder resist is formed on the top surface of the interconnect structure (block 762). Then, the solder resist is patterned in accordance with the circuit design (block 764). And finally, the contact pads for the interconnect structure are finished (block 766).

As both flow charts illustrate, the method of forming an IC package in accordance with method 750 requires less manufacturing steps than the conventional method 700. For example, for each routing layer, the method 750 requires only four (4) manufacturing steps, whereas the conventional method 700 requires eight (8) manufacturing steps. In case of a five (5) routing layer IC package, for example, the convention method 700 would require 20 additional manufacturing steps over that of method 750. Thus, employing one or more z-axis interconnects in IC package design substantially reduces manufacturing steps and costs, and improves the reliability of IC packages. Such advantages of the z-axis interconnect are further illustrated with the following case study.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An integrated circuit (IC) package, comprising:
a semiconductor die including one or more contacts;
a z-axis interconnect including a matrix of electrical conducting elements extending from a top surface of the z-axis interconnect to a bottom surface of the z-axis interconnect, wherein each electrical conducting element is internally insulated from other electrical connecting elements of the matrix, and wherein the one or more semiconductor die contacts are electrically coupled respectively to one or more sets of electrical conducting elements of the matrix by way of one or more electrical connections to the top surface of the z-axis interconnect;
one or more external contacts electrically coupled respectively to the one or more sets of electrical conducting elements of the matrix by way of one or more electrical connections to the bottom surface of the z-axis interconnect; and
an electrical insulating layer including one or more openings disposed over the top surface of the z-axis interconnect, wherein the one or more semiconductor die contacts are electrically coupled respectively to the one or more sets of electrical conducting elements of the matrix through the one or more openings in the first electrical insulating layer.

2. The IC package of claim 1, wherein each electrical conducting element extends substantially perpendicular to the top and bottom surfaces of the z-axis interconnect.

3. The IC package of claim 1, wherein each electrical conducting element comprises an electrical conductor laterally encased by an electrical insulator.

4. The IC package of claim 3, wherein the electrical conductor extends substantially coaxial within the electrical insulator.

5. The IC package of claim 4, wherein the electrical conductor includes a cross-section that is substantially circular, square, rectangular, pentagon, hexagon, or elliptical.

6. The IC package of claim 4, wherein the electrical insulator includes a cross-section that is substantially circular, square, rectangular, pentagon, hexagon, or elliptical.

7. The IC package of claim 4, wherein the electrical conductor has a cross-section different than a cross-section of the electrical insulator.

8. The IC package of claim 1, wherein the matrix of electrically conducting elements are located only in one or more portions extending laterally across the z-axis interconnect.

9. The IC package of claim 8, wherein one or more electrical insulators are located only in one or more remaining portions of the z-axis interconnect.

10. The IC package of claim 9, wherein the one or more electrical insulators each comprises a matrix of electrical insulating elements extending from the top surface to the bottom surface of the z-axis interconnect.

11. The IC package of claim 1, wherein the one or more electrical connection electrically coupling the semiconductor die contacts respectively to the one or more sets of electrical conducting elements comprises one or more wirebonds attached to the one or more sets of electrically conducting elements, respectively.

12. The IC package of claim 1, wherein the one or more electrical connection electrically coupling the semiconductor die contacts respectively to the one or more sets of electrical conducting elements comprises one or more conductive traces attached to the one or more sets of electrically conducting elements, respectively.

13. The IC package of claim 1, further comprising a second electrical insulating layer including one or more openings disposed under the bottom surface of the z-axis interconnect, wherein the one or more external contacts are electrically coupled respectively to the one or more sets of electrical conducting elements of the matrix through the one or more openings in the second electrical insulating layer.

14. The IC package of claim 13, wherein the one or more electrical connection electrically coupling the external contacts respectively to the one or more sets of electrical conducting elements comprises one or more conductive traces attached to the one or more sets of electrically conducting elements, respectively.

15. The IC package of claim 1, further comprising one or more additional z-axis interconnects, each including a matrix of electrically conducting elements extending from a top surface of the additional z-axis interconnect to a bottom surface of the additional z-axis interconnect, wherein the one or more external contacts are electrically coupled to the one or more sets of electrical conducting elements of the matrix of the z-axis interconnect by way of one or more sets of electrical conducting elements of the matrix of the additional z-axis interconnect, respectively.

16. The IC package of claim 1, further comprising a second semiconductor die including one or more second contacts, wherein the one or more second contacts are electrically coupled respectively to one or more second external contacts by way of one or more sets of electrical conducting elements of the z-axis interconnect, respectively.

17. A circuit assembly, comprising:
- a first circuit comprising a printed circuit (PC) board, the first circuit including one or more first contacts;
- a z-axis interconnect including a matrix of electrical conducting elements extending from a top surface of the z-axis interconnect to a bottom surface of the z-axis interconnect, wherein each electrical conducting element is internally insulated from other electrical connecting elements of the matrix, and wherein the one or more first contacts of the first circuit are electrically coupled respectively to one or more sets of electrical conducting elements of the matrix by way of one or more electrical connections to the top surface of the z-axis interconnect; and
- a second circuit comprising a printed circuit (PC) board, the second circuit including one or more second contacts electrically coupled respectively to the one or more sets of electrical conducting elements of the matrix by way of one or more electrical connections to the bottom surface of the z-axis interconnect.

18. The circuit assembly of claim 17, wherein the first circuit comprises an integrated circuit (IC) package.

19. The circuit assembly of claim 17, wherein the second circuit comprises a system or subsystem.

20. The IC package of claim 1, further comprising an electrically-insulated cover configured to cover the semiconductor die.

21. An integrated circuit (IC) package, comprising:
- a plurality of z-axis interconnects, each of the plurality of z-axis interconnects including a matrix of electrical conducting elements extending from a top surface of the respective z-axis interconnect to a bottom surface of the respective z-axis interconnect, each electrical conducting element internally insulated from other electrical connecting elements of the matrix;
- a semiconductor die including one or more contacts, the one or more contacts electrically coupled, respectively, to one or more sets of electrical conducting elements of the matrix of a first z-axis interconnect of the plurality of z-axis interconnects by way of one or more electrical connections to the top surface of the first z-axis interconnect; and
- one or more external contacts electrically coupled, respectively, to the one or more sets of electrical conducting elements of the matrix of a second z-axis interconnect of the plurality of z-axis interconnects by way of one or more electrical connections to the bottom surface of the second z-axis interconnect, the one or more sets of electrical conducting elements of the matrix of the second z-axis interconnect electrically interconnected, respectively, to the one or more sets of electrical conducting elements of the matrix of the first z-axis interconnect.

22. The IC package of claim 21, further comprising:
- a first electrical insulating layer including one or more openings, the one or more contacts electrically coupled through the one or more openings in the first electrical insulating layer, respectively, to the one or more sets of electrical conducting elements of the first matrix; and
- a second electrical insulating layer including one or more openings, the one or more external contacts electrically coupled through the one or more openings in the second electrical insulating layer, respectively, to the one or more sets of electrical conducting elements of the second matrix.

23. The IC package of claim 21, further comprising an electrically-insulated cover configured to cover the semiconductor die.

* * * * *